(12) United States Patent
Chang et al.

(10) Patent No.: US 9,105,651 B2
(45) Date of Patent: Aug. 11, 2015

(54) METHOD OF FABRICATING A MOS DEVICE USING A STRESS-GENERATING MATERIAL

(71) Applicant: United Microelectronics Corp., Hsinchu (TW)

(72) Inventors: Tsung-Hung Chang, Yunlin County (TW); Yi-Wei Chen, Taichung (TW); I-Fang Huang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 47 days.

(21) Appl. No.: 13/940,103

(22) Filed: Jul. 11, 2013

(65) Prior Publication Data

US 2015/0017777 A1    Jan. 15, 2015

(51) Int. Cl.
*H01L 21/00* (2006.01)
*H01L 29/66* (2006.01)

(52) U.S. Cl.
CPC ................................. *H01L 29/66477* (2013.01)

(58) Field of Classification Search
None
See application file for complete search history.

(56) References Cited

U.S. PATENT DOCUMENTS

| 2006/0019455 A1* | 1/2006 | Bu et al. ...................... 438/303 |
| 2009/0140292 A1* | 6/2009 | Liu et al. ...................... 257/190 |
| 2009/0298297 A1* | 12/2009 | Kanarsky et al. ............ 438/761 |
| 2011/0076823 A1* | 3/2011 | Lin et al. ...................... 438/299 |

* cited by examiner

*Primary Examiner* — Charles Garber
*Assistant Examiner* — Brigitte Paterson
(74) *Attorney, Agent, or Firm* — J.C. Patents

(57) ABSTRACT

Provided is a method of fabricating a MOS device including the following steps. A gate structure is formed on a substrate and a first spacer is formed at a sidewall of the gate structure. A first implant process is performed to form source and drain extension regions in the substrate. A spacer material layer is formed on the gate structure, the first spacer and the substrate. A treatment process is performed so that stress from the spacer material layer is applied onto and memorized in a channel between two source and drain extension regions. An anisotropic process is performed to remove a portion of the spacer material so that a second spacer is formed. A second implant process is performed to form source and drain regions in the substrate.

8 Claims, 6 Drawing Sheets

METHOD OF FABRICATING A MOS DEVICE USING A STRESS-GENERATING MATERIAL

BACKGROUND

1. Technical Field

The present invention relates to a method of fabricating a semiconductor device, and more particularly, to a method of fabricating a metal oxide semiconductor (MOS) field effect transistor device.

2. Description of Related Art

Metal oxide semiconductor field effect transistor (MOSFET) is a basic structure widely applied to various semiconductor devices such as memory devices, image sensors, and display devices. To meet the demand of lighter, thinner, and smaller electronic devices, the size of CMOS is continuously shrunk. As the integration of semiconductor devices continues to increase, the dimension of the MOS transistor reduces correspondingly. However, any further size reduction is limited. Therefore, other approaches, for example, by increasing the strain of the transistor's channel to improve the carrier mobility, are currently being evaluated.

SUMMARY

The invention provides a method of fabricating a metal oxide semiconductor (MOS) device to improve carrier mobility.

The present invention is directed to a method of fabricating a MOS device, including the following steps. A gate structure is formed on a substrate, and a first spacer is formed at a sidewall of the gate structure. A first implant process is performed to form source and drain extension regions in the substrate. A spacer material layer is formed on the gate structure, the first spacer and the substrate. A treatment process is performed so that stress from the spacer material layer is applied onto and memorized in a channel between two source and drain extension regions. An anisotropic process is performed to remove a portion of the spacer material so that a second spacer layer is formed. A second implant process is performed to form source and drain regions in the substrate.

In an embodiment, the treatment process comprises an anneal process.

In an embodiment, the anneal process comprises a laser spike annealing (LSA) process or a rapid thermal process (RTP).

In an embodiment, a temperature of the RTP is in a range from about 550° C. to about 1000° C.

In an embodiment, the RTP is performed for about 1 to 30 seconds.

In an embodiment, the source and drain extension regions and the source and drain regions are of N-type.

In an embodiment, the spacer material layer comprises silicon oxide, silicon nitride or combination thereof.

In an embodiment, after the step of the first implant process and before the step of the forming a spacer material layer, the method of fabricating a MOS device further includes a thermal anneal process.

The present invention is also directed to another method of fabricating a MOS device, including the following steps. A substrate including a first region and a second region is provided. A first gate structure and a second gate structure are formed on the substrate in the first region and in the second region. A first spacer is formed at a sidewall of each of the first and the second gate structures. A first implant process is performed to form first source and drain extension regions of a first conductivity type in the substrate in the first region, wherein a first channel is defined by two adjacent first source and drain extension regions. A second implant process is performed to form second source and drain extension regions of a second conductivity type in the substrate in the second region, wherein a second channel is defined by two second source and drain extension regions. A spacer material layer is formed to cover the first and second gate structures, the first spacer and the substrate. A treatment process is performed so that stress from the spacer material layer is applied onto and memorized in the first channel. An anisotropic process is performed to remove a portion of the spacer material so that a second spacer is formed at a sidewall of the first spacer. A third implant process is performed to form first source and drain regions of the first conductivity type in the substrate beside the first gate structure in the first region. A fourth implant process is performed to form second source and drain regions of the second conductivity type in the substrate beside the second gate structure in the second region.

In an embodiment, the treatment process comprises an anneal process.

In an embodiment, the anneal process comprises a laser spike annealing (LSA) process or a RTP or combination of LSA and RTP.

In an embodiment, a temperature of the RTP is in a range from about 550° C. to about 1,000° C.

In an embodiment, the first conductivity type is N-type and the second conductivity type is P-type.

In an embodiment, the method of fabricating a MOS device further includes forming a stress-generating material on the substrate in the second region after the step of the first implant process and before the step of the second implant process.

In an embodiment, the stress-generating material comprises SiGe.

In an embodiment, the method of fabricating a MOS device further includes removing the spacer material layer in the second region before the step of treatment process; and forming a third spacer at the sidewall of the first spacer at the second gate structure before the step of performing the third implant process In an embodiment, the spacer material layer comprises silicon oxide, silicon nitride or combination thereof.

In an embodiment, after the step of the second implant process and before the step of the forming a spacer material layer, the method of fabricating a MOS device further may include a thermal anneal process The invention provides a method of fabricating a metal oxide semiconductor (MOS) device. With the treatment process, a tensile stress from a spacer material is applied onto and memorized in a channel of NMOS device so as to improve carrier mobility. Thereby, the performance of the NMOS device is improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
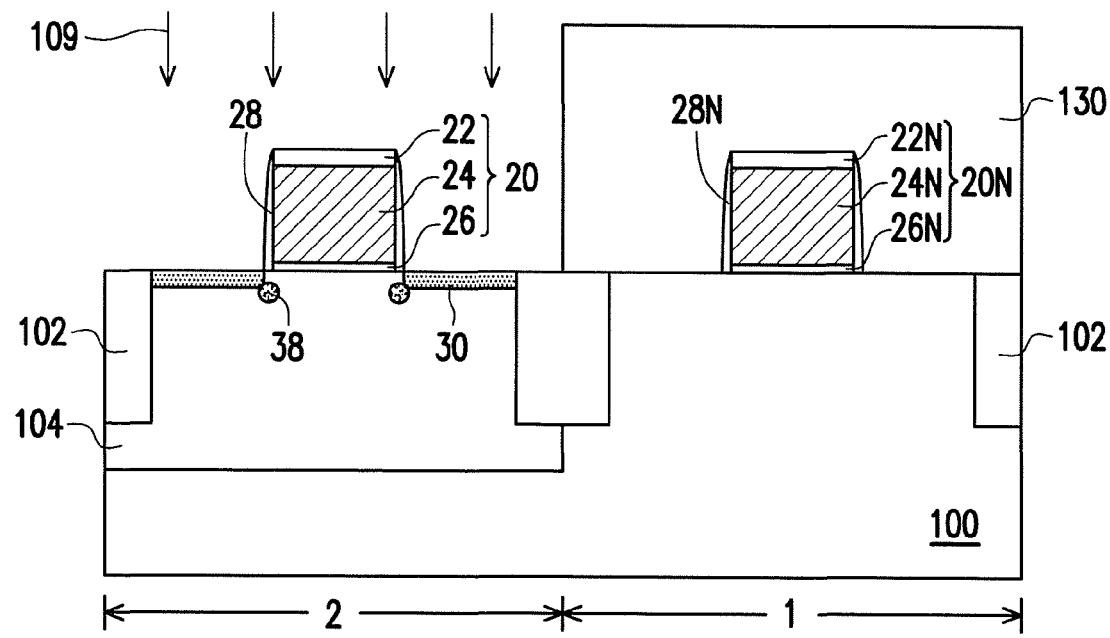
FIGS. 1A-1H are schematic cross-sectional drawings illustrating a method of fabricating a MOS device according to an embodiment of the invention.

Reference will now be made in detail to the embodiments of the invention, examples of which are illustrated in the accompanying drawings. Wherever possible, the same reference numbers are used in the drawings and the description to refer to the same or like elements.

FIGS. 1A-1H are schematic cross-sectional drawings illustrating a method of fabricating a MOS device according to an embodiment of the invention.

Referring to FIG. 1A, a substrate 100 such as a silicon substrate, a silicon-containing substrate, or a silicon-on-insulator (SOI) substrate is provided. The substrate 100 has a region 1 and a region 2. An isolation structure 102 such as shallow trench isolation (STI) is formed in the substrate 100 between the region 1 and the region 2, providing electrical isolation therebetween. In this embodiment, the substrate 100 may be a P-type substrate and an N-well 104 is formed in the region 2. In the subsequent fabrication process, an NMOS can be formed in the region 1, and a PMOS can be formed in the region 2.

Continue referring to FIG. 1A, a gate structure 20 is formed on the N-well 104 in the region 2 and a gate structure 20N is formed on the substrate 100 in the region 1. The gate structure 20 includes, from bottom to top, a gate dielectric layer 26, a gate conductive layer 24, and a hard mask layer 22. The material of the hard mask layer 22 is, for example, silicon nitride, or the hard mask layer 22 can be a stacked structure consisting of a silicon oxide layer and a silicon nitride layer. The material of the gate conductive layer 24 is, for example, doped polysilicon. The gate dielectric layer 26 can be a silicon oxide ($SiO_2$) layer, a high-k gate dielectric layer with a dielectric constant greater than 4, or the combination thereof. The high-k material with a dielectric constant greater than 4 can be metal oxide, such as rare earth metal oxide. The high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. Additionally, an interfacial layer (not shown) can be formed between the high-k gate dielectric layer and the substrate 100. The interfacial layer can be silicon oxide. Further, on the sidewall of the gate structure 20, a spacer 28 may be formed, of which the material can be silicon oxide.

Similarly, the gate structure 20N includes, from bottom to top, a gate dielectric layer 26N, a gate conductive layer 24N, and a hard mask layer 22N. A spacer 28N may be formed on the sidewall of the gate structure 20N. The components of gate structure 20N may be made of the same or similar materials as those of the components of the gate structure 20. The elements, structures, and layers depicted in FIG. 1A may be formed by methods or processes known to a person having ordinary skills in the art. The details are thus omitted herein for brevity.

Referring to FIG. 1A, a mask layer 130 made of, for example, a photoresist material can be formed on the substrate 100 in the region 1. The source and drain extension regions 30 may be formed in the substrate 100 at both sides of the gate structure 20 by an implant process 109, of which the dopants include boron (B) or gallium (Ga). In such an embodiment, the source and drain extension regions 30 are p-type lightly doped drains (PLDDs). Then, n-type pocket implant regions 38 are formed by a pocket implant process.

Figure 1B:
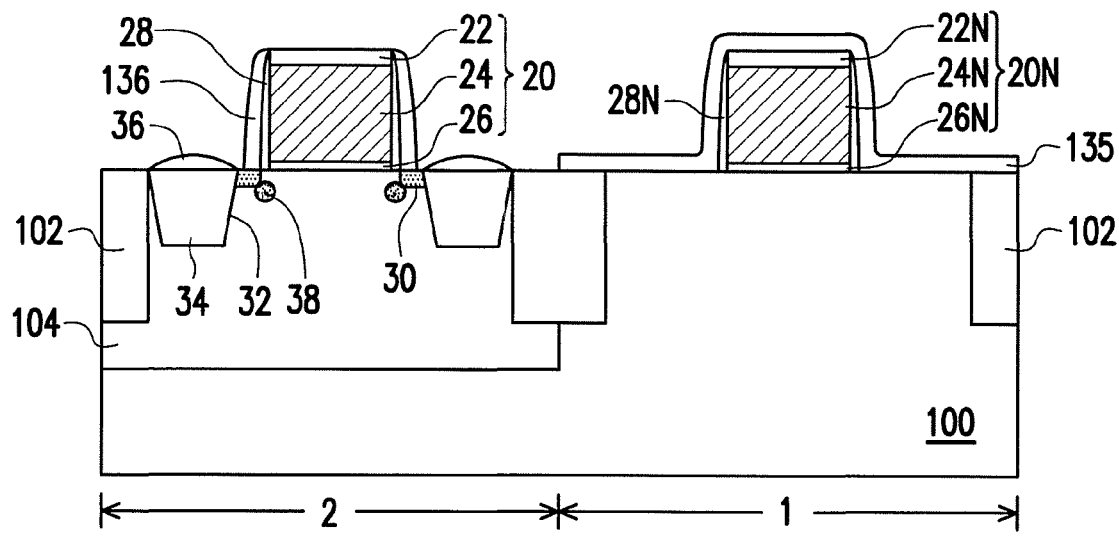

Then, referring to FIG. 1B, the mask layer 130 is removed. A disposable material layer (not shown) are formed on the substrate 100 and subsequently subjected to an etching process with a mask (e.g. photoresist, not shown) covering the region 1 to foam a disposable layer 135 in the region 1 and form a disposable spacer 136 adjacent to the spacer 28 in the region 2. The mask is then removed. Openings 32 may be formed in the substrate 100 at both sides of the gate structure 20 by, for example, a dry etching process. A stress-generating material is then grown to fill the openings 32 to form stress-generating layers 34. For an N-well in a silicon substrate, the stress-generating material can be SiGe. The SiGe growth can be carried out by, for example, epitaxial growth. Specifically, each of the stress-generating layers 34 may be composed of an un-doped SiGe layer and a doped SiGe layer stacked in sequence. Silicon caps 36 may be subsequently formed on the stress-generating layers 34 for later silicide formation.

Figure 1C:
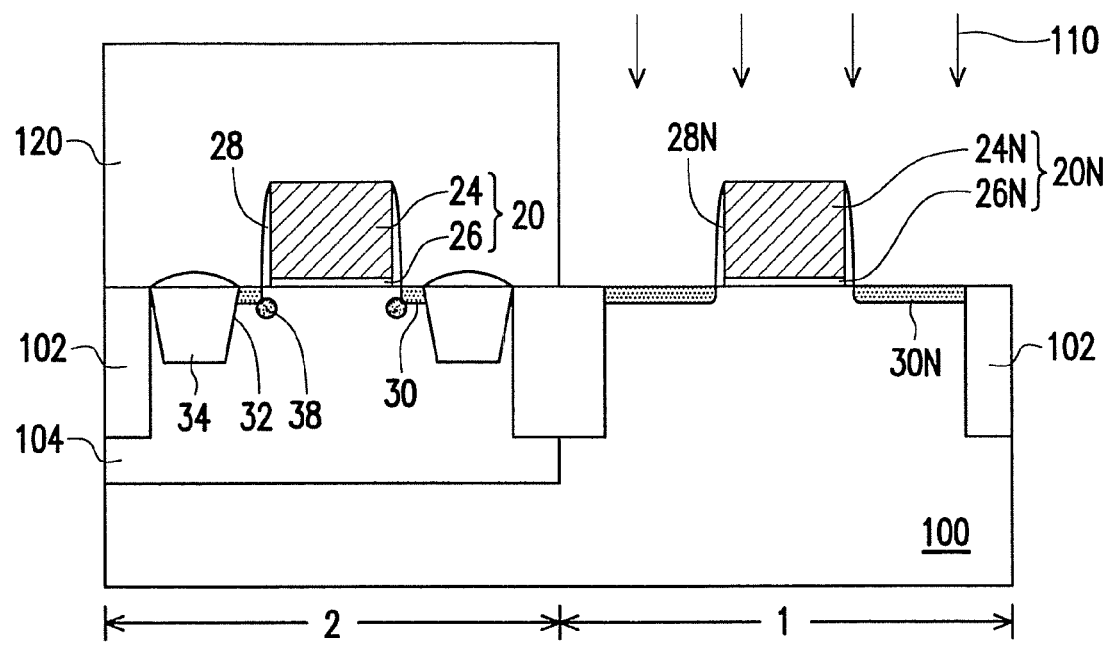

Referring to FIG. 1C, the disposable layer 135, the disposable spacer 136 and the hard mask layers 22 and 22N are removed after the formation of the stress-generating layers 34 and the silicon caps 36. Thereafter, a mask layer 120 made of, for example, a photoresist material can be formed on the substrate 100 in the region 2. An implant process 110 is performed to form source and drain extension regions 30N in the substrate 100 in the region 1. In an embodiment, the source and drain extension regions 30N are n-type lightly doped drains (NLDDs) disposed at both sides of the gate structure 20N. The dopants of the implant process 110 include arsenic (As) or phosphorous (P). After the implant process 110, portion silicon on surfaces of the source and drain extension regions 30N may be changed to amorphous silicon due to the implant process.

Figure 1D:
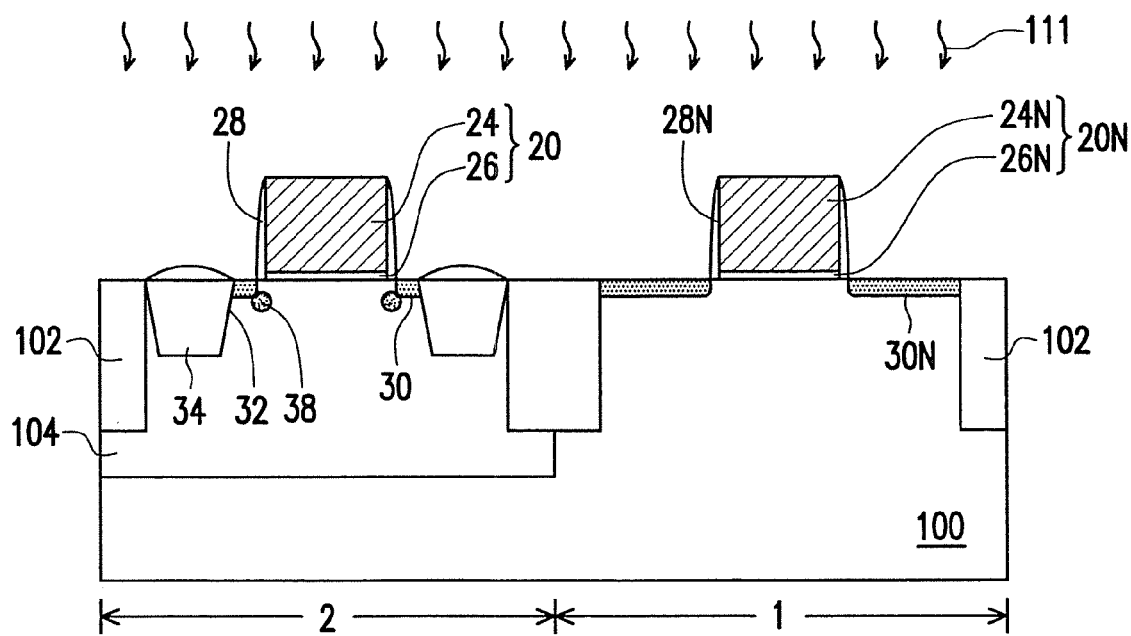

Referring to FIG. 1D, the mask layer 120 is removed, and a thermal annealing process 111, e.g. a laser spike annealing (LSA), may be optionally conducted to activate the dopants in the source and drain extension regions 30N.

Figure 1E:
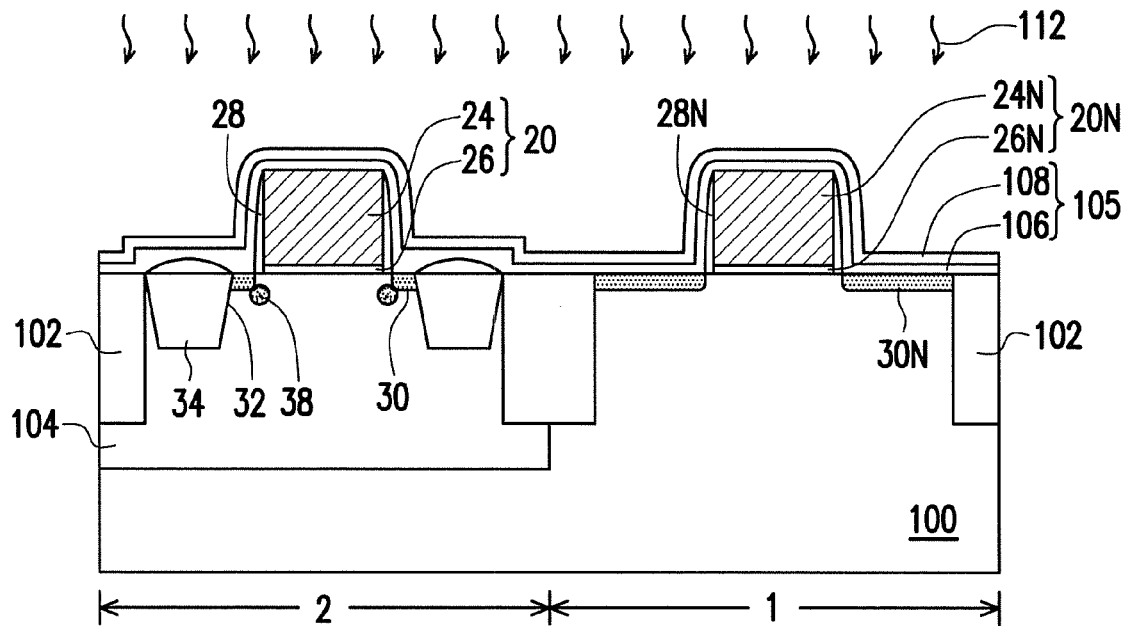

Referring to FIG. 1E, a spacer material layer 105 is formed on the substrate 100 in the regions 1 and 2. In this embodiment, the spacer material layer 105 includes a silicon oxide layer 106 and a silicon nitride layer 108. These layers may be formed by chemical vapor deposition.

Referring to FIG. 1E, after the formation of the spacer material layer 105, a treatment process 112 may be conducted to activate the dopants in the source and drain extension regions 30N, and the amorphous silicon on the surfaces of the source and drain extension regions 30N is then re-crystallized. Furthermore, after the treatment process 112 is conducted, the tensile stress from the spacer material layer 105 is applied onto the channel of the NMOS device (also know as a stress memorization technology). The treatment process 112 includes an annealing process, e.g. a laser spike annealing (LSA) process or a rapid thermal process (RTP) or combination of LSA and RTP. The RTP for the thermal annealing process 112 is performed at a temperature in a range from about 550° C. to about 1,000° C. for about 1 to 30 seconds.

Figure 1F:
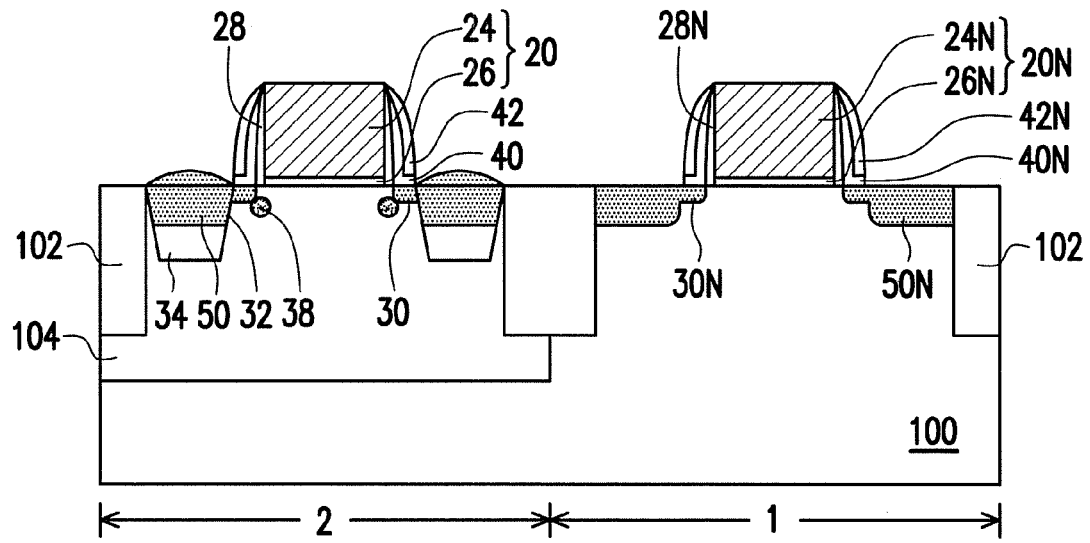

Referring to FIG. 1F, after the treatment process 112, an isotropic etching process, e.g. a dry etching process, is performed to remove a portion of the silicon nitride layer 108 so that silicon nitride spacers 42 and 42N are formed at the sidewalls of the gate structures 20 and 20N, and the silicon oxide layer 106 not covered by silicon nitride spacers 42 and 42N are exposed. The exposed portion of silicon oxide layer 106 is then removed by a wet etching process having a different etching rate with respect to silicon oxide and silicon nitride, leaving a silicon oxide spacer 40 and the silicon nitride spacer 42 disposed adjacent to the sidewall of the gate structures 20, and leaving a silicon oxide spacer 40N and the silicon nitride spacer 42N adjacent to the sidewall of the gate structures 20N.

Referring to FIG. 1F, a mask layer (not shown) made of, for example, a photoresist material can be formed on the substrate 100 in the region 2. An implant process is performed to form source and drain regions 50N in the substrate 100 in the region 1. In an embodiment, the source and drain regions 50N are n-type doped regions disposed at both sides of the silicon nitride spacer 40N. The dopants of the implant process include arsenic (As) or phosphorous (P). Another mask layer (not shown) made of, for example, a photoresist material can be formed on the substrate 100 in the region 1. The source and drain regions 50 may be formed in the substrate 100 at both sides of the silicon nitride spacer 40 by another implant process, of which the dopants include boron (B) or gallium (Ga).

Figure 1G:
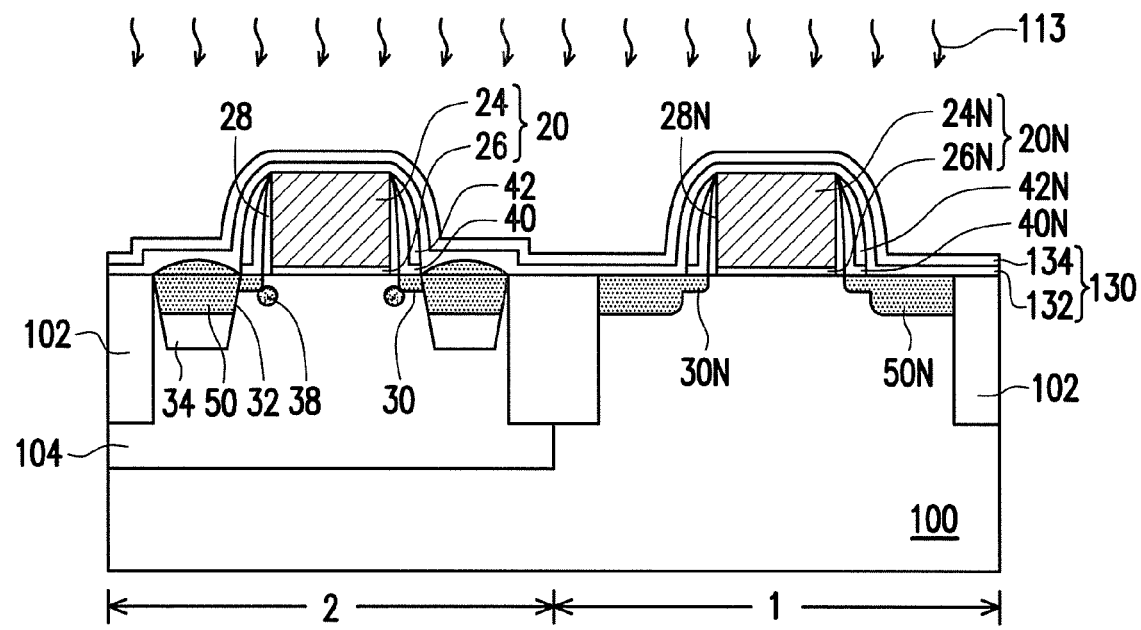

Referring to FIG. 1G, a stress material layer 130 is formed on the substrate 100 in the regions 1 and 2. In this embodiment, the stress material layer 130 includes a silicon oxide layer 132 and a silicon nitride layer 134 on the silicon oxide layer 132. These layers may be formed by chemical vapor deposition.

Referring to FIG. 1G, a thermal annealing process 113 may be conducted to activate the dopants in the source and drain regions 50 and 50N and relax the lattice mismatch caused by the implant processes. The thermal anneal process 113 comprises a spike annealing process or RTP.

Figure 1H:
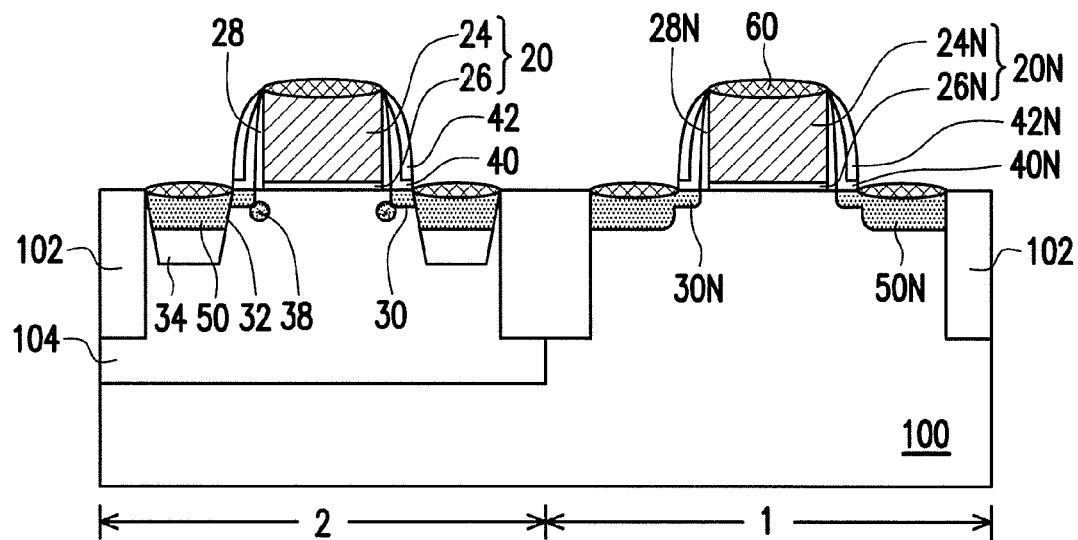

Referring to FIG. 1H, the stress material layer 130 is removed. A patterned salicide blocking layer (not shown) is formed over the non-salicide device (not shown) on the substrate 100 and then a salicide process is performed to form salicide layers 60. For example, as shown in FIG. 1H, the salicide layer 60 is formed on the tops of the gate conductive layers 24 and 24N and on the top surfaces of the source and drain regions 50 and 50N. The salicide layer 60 includes a silicide of at least one refractory metal selected from the group consisting of Ni, W, Co, Ti, Mo and Pt.

FIGS. 2A-2D are schematic cross-sectional drawings illustrating a method of fabricating a MOS device according to another embodiment of the invention.

Figure 2A:
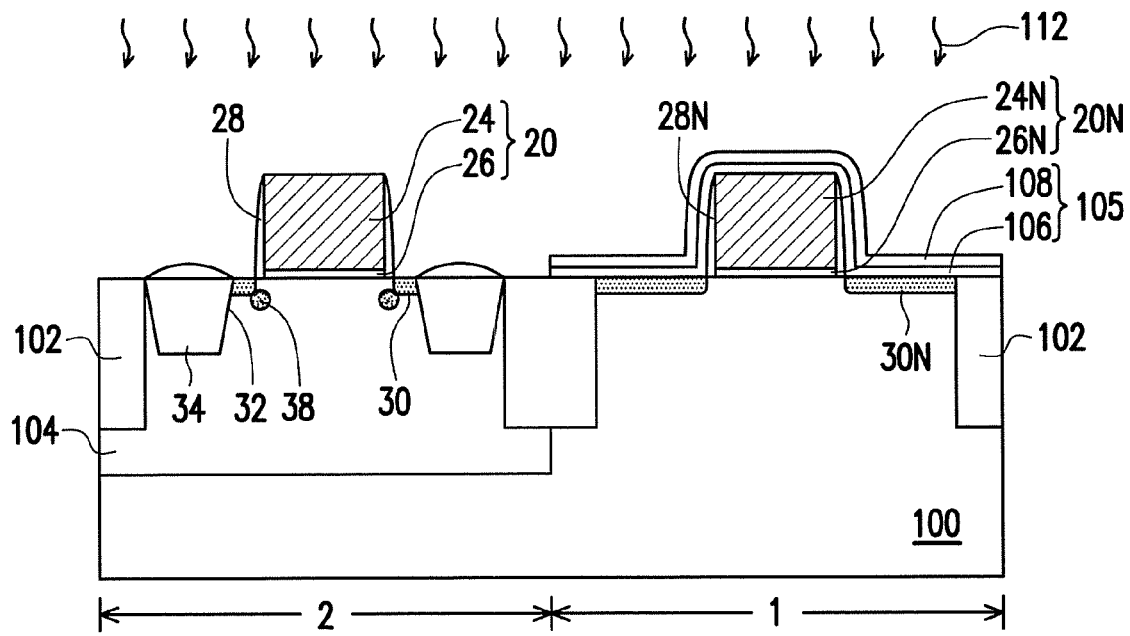
FIGS. 2A-2D are schematic cross-sectional drawings illustrating a method of fabricating a MOS device according to another embodiment of the invention.

An intermediate structure of FIG. 1E is provided in which the treatment process 112 has not been conducted yet. Referring to FIG. 2A, the spacer material layer 105 in the second region 2 may be removed, so that the tensile stress from the spacer material layer 105 is applied only onto the channel of the NMOS device after the treatment process 112 is conducted.

Figure 2B:
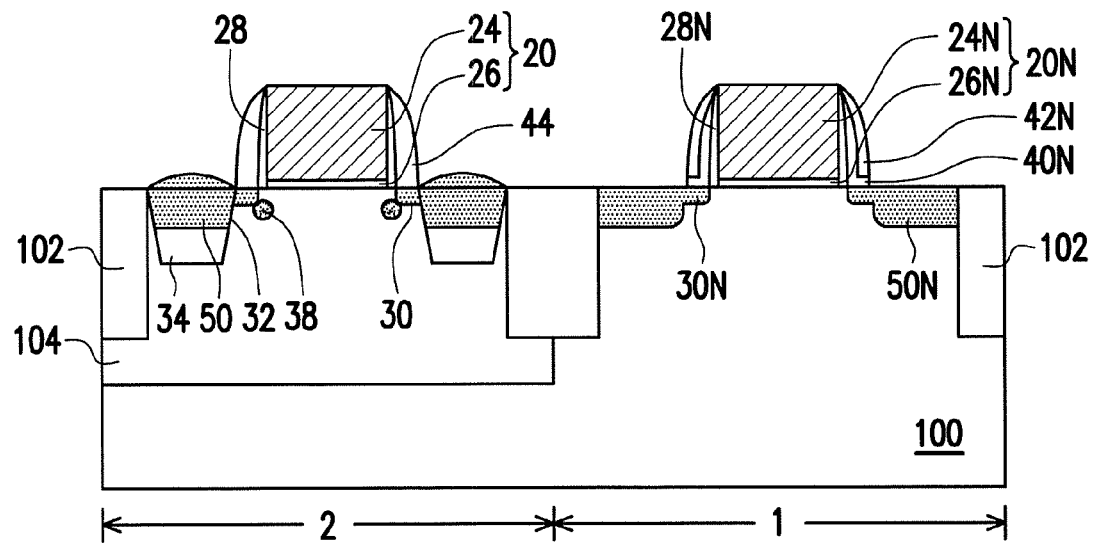

Referring to FIG. 2B, a spacer 44 is formed at the sidewall of the spacer 28N at the gate structure 20N. A spacer material of the spacer 44 can be a silicon oxide layer, a silicon nitride layer or a combination thereof. The spacer material may be formed by chemical vapor deposition. Thereafter, according to the process referred to FIG. 1F, the source and drain regions 50N are formed in the substrate 100 in the region 1, and the source and drain regions 50 are formed in the substrate 100 in the region 2.

Figure 2C:
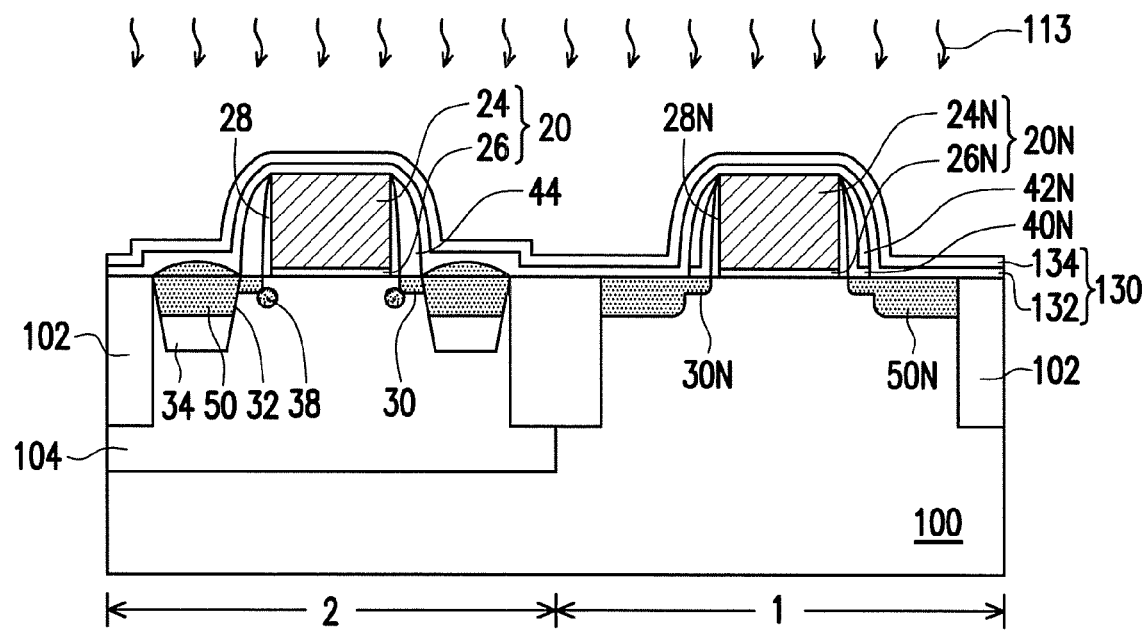

Referring to FIG. 2C, the stress material layer 130 is formed on the substrate 100 according to the above embodiment referred to FIG. 1G. The thermal annealing process 113 may be conducted.

Figure 2D:
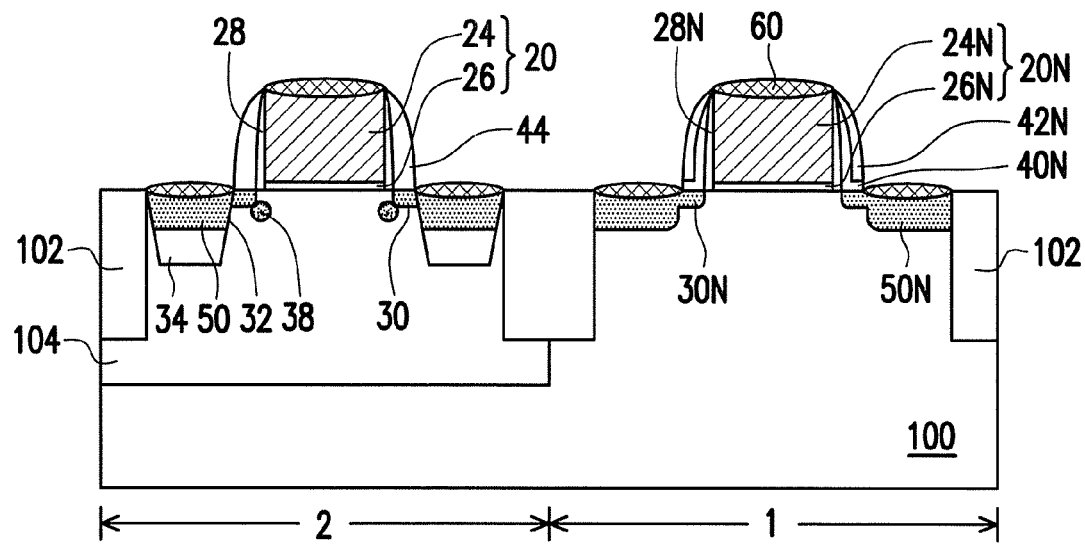

Referring to FIG. 2D, according to the method described above embodiment referred to FIG. 1H, the stress material layer 130 is removed. The salicide layer 60 is formed on the tops of the gate conductive layers 24 and 24N and on the top surfaces of the source and drain regions 50 and 50N.

The invention provides a method of fabricating a metal oxide semiconductor (MOS) field effect transistor device. With the treatment process of the invention, a tensile stress from a spacer material is applied onto and memorized in a channel of NMOS field effect transistor device so as to improve carrier mobility. Thereby, the performance of the NMOS field effect transistor device is improved by at least 5%.

The present invention has been disclosed above in the embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of fabricating a MOS device, comprising:
   providing a substrate comprising a first region and a second region;
   forming a first gate structure and a second gate structure respectively on the substrate in the first and second regions;
   forming a first spacer at a sidewall of each of the first and second gate structures;
   performing a first implant process to form first source and drain extension regions of a first conductivity type in the substrate in the first region, wherein a first channel is defined by two adjacent first source and drain extension regions;
   performing a second implant process to form second source and drain extension regions of a second conductivity type in the substrate in the second region, wherein a second channel is defined by two adjacent second source and drain extension regions;
   forming a spacer material layer to cover the first and second gate structures, the first spacer and the substrate;
   performing an anisotropic process to remove a portion of the spacer material layer so that a second spacer is formed at a sidewall of the first spacer;
   after the step of forming the spacer material layer and before the step of performing the anisotropic process, performing a treatment process so that stress from the spacer material layer is applied onto and memorized in the first channel;
   performing a third implant process to form first source and drain regions of the first conductivity type in the substrate beside the first gate structure in the first region; and
   performing a fourth implant process to form second source and drain regions of the second conductivity type in the substrate beside the second gate structure in the second region,
   wherein the first conductivity type is N-type and the second conductivity type is P-type, and
   wherein the method further comprises forming a stress-generating material on the substrate in the second region after the step of performing the first implant process and before the step of performing the second implant process.

2. The method of claim 1, wherein the treatment process comprises an anneal process.

3. The method of claim 2, wherein the anneal process comprises a laser spike annealing (LSA) process or a RTP or combination of LSA and RTP.

4. The method of claim 2, wherein a temperature of the RTP is in a range from about 550° C. to about 1,000° C.

5. The method of claim 1, wherein the stress-generating material comprises SiGe.

6. The method of claim 1, further comprising:
removing the spacer material layer in the second region before the step of performing the treatment process; and
forming a third spacer at the sidewall of the first spacer in the second region before the step of performing the third implant process.

7. The method of claim 1, wherein the spacer material layer comprises silicon oxide, silicon nitride or a combination thereof.

8. The method of claim 1, further comprising performing a thermal anneal process after the step of performing the second implant process and before the step of forming the spacer material layer.

* * * * *